(12) United States Patent
Zheng (10) Patent No.: US 10,937,380 B2
(45) Date of Patent: Mar. 2, 2021

(54) SHIFT REGISTER AND DRIVING METHOD THEREFOR, GATE DRIVING CIRCUIT AND DISPLAY APPARATUS

(71) Applicant: BOE TECHNOLOGY GROUP CO., LTD., Beijing (CN)

(72) Inventor: Can Zheng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 320 days.

(21) Appl. No.: 15/865,550

(22) Filed: Jan. 9, 2018

(65) Prior Publication Data

US 2018/0330685 A1 Nov. 15, 2018

(30) Foreign Application Priority Data

May 10, 2017 (CN) .......................... 201710326524.3

(51) Int. Cl.
*G11C 19/00* (2006.01)
*G09G 3/36* (2006.01)
(Continued)

(52) U.S. Cl.
CPC ............. *G09G 3/3674* (2013.01); *G09G 3/20* (2013.01); *G09G 3/3266* (2013.01);
(Continued)

(58) Field of Classification Search
None
See application file for complete search history.

(56) References Cited

U.S. PATENT DOCUMENTS 8,019,039 B1 * 9/2011 Tsai ........................ G11C 19/28
377/64
8,952,944 B2 * 2/2015 Choi ...................... H03K 19/00
345/204

(Continued)

FOREIGN PATENT DOCUMENTS

CN 102819998 A 12/2012
CN 104425035 A 3/2015
(Continued)

OTHER PUBLICATIONS

First Office Action, including Search Report, for Chinese Patent Application No. 201710326524.3, dated Dec. 11, 2018, 12 pages.

*Primary Examiner* — Tuan T Lam
(74) *Attorney, Agent, or Firm* — Westman, Champlin & Koehler, P.A.

(57) ABSTRACT

Provided is a shift register, comprising an input circuit, an output circuit, and a control circuit, which are electrically connected to a control node. The input circuit is electrically connected with a signal input terminal of the shift register, and is configured to input an input signal provided by the signal input terminal to the control node. The control circuit is electrically connected with a working power supply terminal, and is configured to input an operation voltage provided by the working power supply terminal to the control node. The output circuit is electrically connected with a signal output terminal of the shift register and a clock signal line, and is configured to input one of a voltage of the control node and the first clock signal provided by the clock signal line to the signal output terminal.

8 Claims, 4 Drawing Sheets

(51) Int. Cl.
*G09G 3/3266* (2016.01)
*G11C 19/28* (2006.01)
*G09G 3/20* (2006.01)

(52) U.S. Cl.
CPC ............ *G09G 3/3677* (2013.01); *G11C 19/28* (2013.01); *G11C 19/287* (2013.01); *G09G 2300/0426* (2013.01); *G09G 2310/0286* (2013.01); *G09G 2310/08* (2013.01)

(56) References Cited

U.S. PATENT DOCUMENTS

| | | | |
|---|---|---|---|
| 9,691,312 B2 | 6/2017 | Wang et al. | |
| 10,199,006 B2* | 2/2019 | Umezaki | G09G 3/3688 |
| 2005/0008114 A1* | 1/2005 | Moon | G09G 3/3677 |
| | | | 377/64 |
| 2011/0227884 A1* | 9/2011 | Chung | G09G 3/3266 |
| | | | 345/204 |
| 2012/0188210 A1* | 7/2012 | Zhang | G09G 3/3677 |
| | | | 345/204 |
| 2013/0272487 A1* | 10/2013 | Tobita | G09G 3/3677 |
| | | | 377/79 |
| 2014/0064436 A1* | 3/2014 | Ma | G11C 19/28 |
| | | | 377/64 |
| 2014/0064439 A1 | 3/2014 | Qing et al. | |
| 2014/0119491 A1* | 5/2014 | Liu | G11C 19/28 |
| | | | 377/64 |
| 2015/0262703 A1* | 9/2015 | Murakami | G09G 3/20 |
| | | | 345/214 |
| 2015/0279481 A1* | 10/2015 | Sasaki | G11C 19/184 |
| | | | 377/69 |
| 2016/0018844 A1* | 1/2016 | Sasaki | G11C 19/28 |
| | | | 713/600 |
| 2016/0071614 A1* | 3/2016 | Lee | G09G 5/006 |
| | | | 345/214 |
| 2016/0125847 A1* | 5/2016 | Gu | G09G 3/3677 |
| | | | 345/205 |
| 2017/0092376 A1* | 3/2017 | Wang | G09G 3/3677 |
| 2017/0193916 A1* | 7/2017 | Ma | G09G 3/3266 |
| 2017/0364170 A1 | 12/2017 | Gu et al. | |
| 2018/0047341 A1* | 2/2018 | Ma | G09G 3/3677 |
| 2018/0240429 A1* | 8/2018 | Ogawa | G11C 19/28 |
| 2018/0286342 A1* | 10/2018 | Li | G09G 3/3677 |

FOREIGN PATENT DOCUMENTS

| | | |
|---|---|---|
| CN | 204257215 U | 4/2015 |
| CN | 105096879 A | 11/2015 |
| CN | 105427790 A | 3/2016 |

* cited by examiner

SHIFT REGISTER AND DRIVING METHOD THEREFOR, GATE DRIVING CIRCUIT AND DISPLAY APPARATUS

CROSS REFERENCE TO RELATED APPLICATION

The present application claims priority to the application No. 201710326524.3, entitled "Shift Register and Driving Method for the same, Gate driving circuit and Display apparatus", filed on May 10, 2017, which is hereby incorporated by reference in its entirety.

FIELD

The present disclosure relates to the field of display technology, and particularly to a shift register and a driving method for the same, a gate driving circuit and a display apparatus.

BACKGROUND

Usually, a gate driver on array (GOA) technology is adopted in liquid crystal displays (LCDs) or organic light-emitting diode (OLED) displays to integrate a gate switch circuit, such as a thin film transistor (TFT), on an array substrate of a display panel to form a scan driver for the display panel. A GOA circuit is composed of multiple cascaded shift registers. An output terminal of each shift register is electrically connected to gates of switch transistors in a corresponding row of pixel units to drive the pixel units of the corresponding row.

SUMMARY

The present disclosure provides a shift register, comprising an input circuit, an output circuit and a control circuit, wherein the input circuit, the output circuit and the control circuit are electrically connected to a control node, the input circuit is further electrically connected with a signal input terminal of the shift register, and is configured to input an input signal provided by the signal input terminal to the control node under the control of a first control signal provided by a first control signal line, the control circuit is further electrically connected with a working power supply terminal, and is configured to input an operation voltage provided by the working power supply terminal to the control node under the control of a third control signal provided by a third control signal line, the output circuit is further electrically connected with a signal output terminal of the shift register and a clock signal line, and is configured to input one of a voltage of the control node and a first clock signal provided by the clock signal line to the signal output terminal under the control of the voltage of the control node and a second control signal provided by a second control signal line.

Optionally, the input circuit comprises a first transistor, wherein a control electrode of the first transistor is electrically connected with the first control signal line, a first electrode of the first transistor is electrically connected with the signal input terminal, and a second electrode of the first transistor is electrically connected with the control node.

Optionally, the output circuit comprises a third transistor, a fourth transistor and a capacitor, wherein a control electrode of the third transistor is electrically connected with the control node, a first electrode of the third transistor is electrically connected with the clock signal line, and a second electrode of the third transistor is electrically connected with the signal output terminal, a control electrode of the fourth transistor is electrically connected with the second control signal line, a first electrode of the fourth transistor is electrically connected with the control node, and a second electrode of the fourth transistor is electrically connected with the signal output terminal, a first end of the capacitor is electrically connected with the control node, and a second end of the capacitor is electrically connected with the signal output terminal.

Optionally, the second control signal line is electrically connected with the clock signal line.

Optionally, the control circuit comprises a second transistor, wherein a control electrode of the second transistor is electrically connected with the third control signal line, a first electrode of the second transistor is electrically connected with the working power supply terminal, and a second electrode of the second transistor is electrically connected with the control node.

Optionally, the first transistor, the second transistor, the third transistor and the fourth transistor are P type transistors.

Optionally, the first control signal is a second clock signal, and the second control signal is a third clock signal, and wherein duty ratios of the first clock signal, the second clock signal and the third clock signal are 33%.

The present disclosure further provides a gate driving circuit, which comprises the above shift register.

The present disclosure further provides a display apparatus, which comprises the above gate driving circuit.

The present disclosure further provides a driving method for a shift register, wherein the shift register is the shift register described above, and the driving method for the shift register comprises: the input circuit inputs the input signal provided by the signal input terminal to the control node under the control of the first control signal provided by the first control signal line;

the output circuit inputs the first clock signal provided by the clock signal line to the signal output terminal under the control of the control node and the second control signal provided by the second control signal line;

the control circuit inputs the operation voltage provided by the working power supply terminal to the control node under the control of the third control signal provided by the third control signal line; and the output circuit inputs the voltage of the control node to the signal output terminal under the control of the control node and the second control signal provided by the second control signal line.

DETAILED DESCRIPTION

In order to make a person skilled in the art understand solutions of the present disclosure better, a shift register and a driving method for the same, a gate driving circuit and a display apparatus in the present disclosure will be described in detail below in conjunction with accompany drawings.

It should be noted that, transistors adopted in embodiments of the present disclosure may be thin film transistors, field effect transistors or other devices with same or similar characteristics. Since a source and a drain of the adopted transistor are symmetrical, the source and the drain are not different from each other. However, in embodiments of the present disclosure, in order to distinguish the source of the transistor from the drain of the transistor, one of the source and drain is called a first electrode, the other one is called a second electrode, and a gate of the transistor is called a control electrode.

As demand of users on a display apparatus with high-definition, high resolution and narrow bezel is increasing, the number of pixels of the display apparatus is continuously increased, thus the number of the rows needed to be scanned by a shift register in one frame time is increased. Therefore, under a condition that the size of the display screen is unchanged, layout area for each row of shift registers will be gradually decreased. In addition, due to the requirement of narrow bezel, requirement on the area of each row of shift registers is more stringent.

Figure 1:
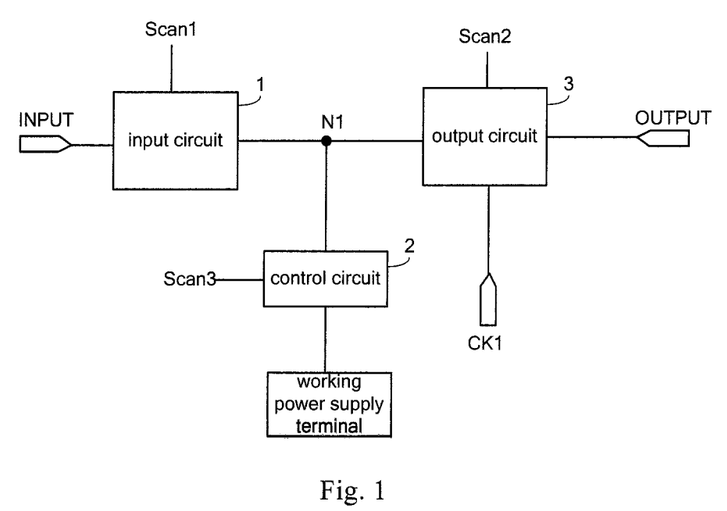
FIG. 1 is a structural diagram of a shift register in an embodiment of the disclosure.

FIG. 1 is a structural diagram of a shift register in an embodiment of the disclosure, as shown in FIG. 1, the shift register comprises an input circuit 1, an output circuit 3 and a control circuit 2, wherein the input circuit 1, the output circuit 3 and the control circuit 2 are electrically connected to a control node N1.

The input circuit 1 is electrically connected with a signal input terminal INPUT of the shift register, and is configured to input an input signal provided by the signal input terminal INPUT to the control node N1 under the control of a first control signal provided by a first control signal line Scan1.

The control circuit 2 is electrically connected with a working power supply terminal, and is configured to input an operation voltage provided by the working power supply terminal to the control node N1 under the control of a third control signal provided by a third control signal line Scan3.

The output circuit 3 is electrically connected with a signal output terminal OUTPUT of the shift register and a clock signal line CK1, and is configured to input one of a voltage of the control node N1 and the first clock signal provided by the clock signal line CK1 to the signal output terminal OUTPUT under the control of the voltage of the control node N1 and a second control signal provided by a second control signal line Scan2.

The structure of the shift register provided in the present disclosure is simple, which is beneficial to the realization of high resolution and narrow bezel of the display panel.

Figure 2:
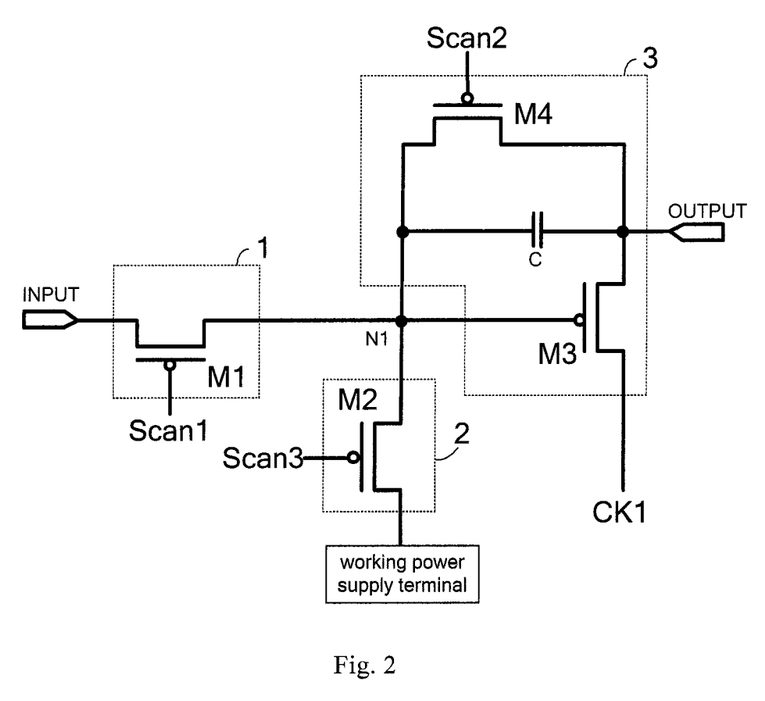
FIG. 2 is another structural diagram of the shift register in the embodiment of the disclosure.

FIG. 2 is another structural diagram of the shift register in the embodiment of the disclosure. FIG. 2 shows a specific structure of the shift register shown in FIG. 1, wherein the input circuit 1 comprises a first transistor M1. A control electrode of the first transistor M1 is electrically connected with the first control signal line Scan1, a first electrode of the first transistor M1 is electrically connected with the signal input terminal INPUT, and a second electrode of the first transistor M1 is electrically connected with the control node N1.

Optionally, the output circuit 3 comprises a third transistor M3, a fourth transistor M4 and a capacitor C. A control electrode of the third transistor M3 is electrically connected with the control node N1, a first electrode of the third transistor M3 is electrically connected with the clock signal line CK1, and a second electrode of the third transistor M3 is electrically connected with the signal output terminal OUTPUT. A control electrode of the fourth transistor M4 is electrically connected with the second control signal line Scan2, a first electrode of the fourth transistor M4 is electrically connected with the control node N1, and a second electrode of the fourth transistor M4 is electrically connected with the signal output terminal OUTPUT. A first end of the capacitor C is electrically connected with the control node N1, and a second end of the capacitor C is electrically connected with the signal output terminal OUTPUT.

Further optionally, the second control signal line Scan2 may be the clock signal line CK1, which can effectively reduce kinds and the number of the signal lines in the shift register, so that the volume occupied by the shift register is reduced, facilitating realization of narrow bezel of the display panel.

Optionally, the control circuit 2 comprises a second transistor M2. A control electrode of the second transistor M2 is electrically connected with a third control signal line Scan3, a first electrode of the second transistor M2 is electrically connected with the working power supply terminal, and a second electrode of the second transistor M2 is electrically connected with the control node N1. The working power supply terminal is configured to supply a high level signal.

It can be seen from above that, only four transistors and one capacitor C are needed in the shift register provided by this embodiment, so that the shift register has a simple structure and needs less transistors provided therein, which is beneficial to the realization of high resolution and narrow bezel of the display panel.

Optionally, all the transistors in the shift register may be P type transistors, and alternatively, they may be N type transistors. In this case, the transistors in the shift register can be manufactured simultaneously by same processes, thus effectively shortening the production cycle.

Optionally, the first control signal is a second clock signal, and the second control signal is a third clock signal. In this embodiment, the control accuracy may be ensured by selecting the clock signal as the control signal. Optionally, duty ratios of the first clock signal, the second clock signal and the third clock signal are 33%.

The operation procedure of the shift register provided in this embodiment will be described in detail below in conjunction with the accompanying drawings. Voltages of the input signal and the first clock signal are $V_L$ when they are at low level, and are $V_H$ when they are at high level. Voltages of the first control signal and the third control signal are $V_L'$ (wherein, VL' is slightly less than $V_L$) when they are at a low level, and are $V_H'$ ($V_H'$ is slightly greater than $V_H$) when they are at a high level. The threshold voltage of each transistor is $V_{th}$ (the threshold voltage of a P type transistor is generally less than or equal to 0V). The voltage of the high level signal supplied by the working power supply is $V_H$.

Figure 3:
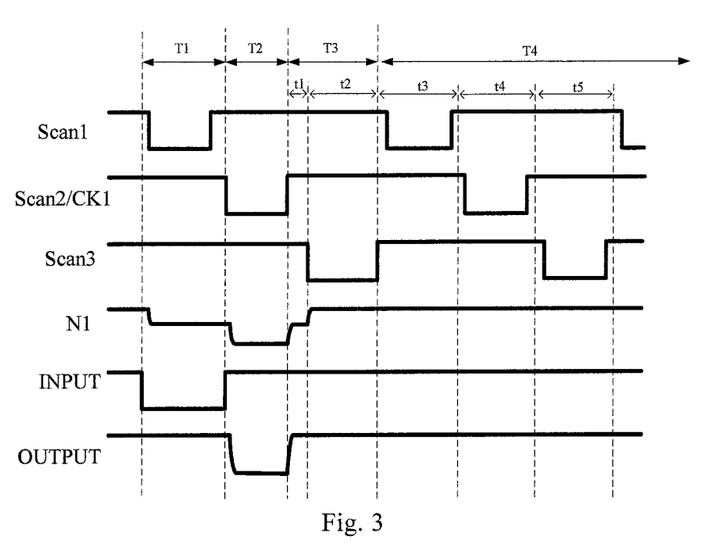
FIG. 3 is an operation timing diagram of the shift register shown in FIG. 2.

FIG. 3 is an operation timing diagram of the shift register shown in FIG. 2. As shown in FIG. 3, the operation procedure of the shift register includes the following four stages T1-T4.

In the first stage T1, a input signal provided by the signal input terminal INPUT is at a low level, the first control signal provided by the first control signal line Scan1 is at a low level, the first clock signal provided by the clock signal line CK1 (and the second control signal provided by the second control signal line Scan2) is at a high level, and the third control signal provided by the third control signal line Scan3 is at a high level.

Since the first control signal is at a low level and the input signal is at a low level, a voltage between the gate and the source of the first transistor M1 is equal to $V_L'-V_L$ (which is less than 0), so that the first transistor M1 is turned on and operates in a nonlinear area. Threshold loss occurs during the input signal at a low level being written to the control node N1 through the first transistor M1, at this time, the voltage of the control node N1 is $V_L+|V_{th}|$.

Furthermore, since the first clock signal is at a high level, a voltage between the gate and the source of the third transistor M3 is $V_L+|V_{th}|-V_H$, which is less than the threshold voltage $V_{th}$ of the third transistor M3, so that the third transistor M3 is turned on, the first clock signal at a high level is written to the signal output terminal OUTPUT through the third transistor M3, the signal output terminal OUTPUT outputs a high level signal, a voltage of which is $V_H$.

At this time, a voltage across two ends of the capacitor C is $V_L+|V_{th}|-V_H$.

For the second transistor M2, a voltage between the gate and the source thereof is $V_H-V_L+|V_{th}|$ (which is far greater than 0), the second transistor M2 is in a turn-off state. For the fourth transistor M4, a voltage between the gate and the source thereof is $V_H'-V_H$ (which is greater than 0), and the fourth transistor M4 is in a turn-off state.

In a second stage T2, the input signal provided by the signal input terminal INPUT is at a high level, the first control signal provided by the first control signal line Scan1 is at a high level, the first clock signal provided by the clock signal line CK1 is at a low level, and the third control signal provided by the third control signal line Scan3 is at a high level.

Since the first control signal is at a high level and the input signal is at a high level, the voltage between the gate and the source of the first transistor M1 is equal to $V_H'-V_H$ (which is greater than 0), thus the first transistor M1 is turned off.

Since the first clock signal is at a low level, the first clock signal at a low level is written to the signal output terminal OUTPUT through the third transistor M3, and the signal output terminal OUTPUT outputs a low level signal, a voltage of which is $V_L$.

At this time, the capacitor C maintains a voltage across two ends thereof unchanged due to its bootstrap effect, and the voltage of the control node N1 is pulled down to $2V_L+|V_{th}|-V_H$. It should be noted that, although the first clock signal (the signal provided by the second control signal line Scan2) input by the control electrode of the fourth transistor M4 is at a low level, since a voltage of the source of the fourth transistor M4 is relatively low, a voltage between the gate and the source of the fourth transistor M4 is relatively large, the fourth transistor M4 is turned off.

The third stage T3 includes two sub-stages: a first sub-stage t1 and a second sub-stage t2.

In the first sub-stage t1, the input signal provided by the signal input terminal INPUT is at a high level, the first control signal provided by the first control signal line Scan1 is at a high level, the first clock signal provided by the clock signal line is at a high level, and the third control signal provided by the third control signal line Scan3 is at a high level.

Since the first clock signal is at a high level, the first clock signal at the high level is written to the signal output terminal OUTPUT through the third transistor M3, and the signal output terminal OUTPUT outputs a high level signal, a voltage of which is $V_H$.

At this time, the capacitor C maintains a voltage across two ends thereof unchanged due to its bootstrap effect, and the voltage of the control node N1 is pulled up to $V_L+|V_{th}|$.

In the second sub-stage t2, the input signal provided by the signal input terminal INPUT is at a high level, the first control signal provided by the first control signal line Scan1 is at a high level, the first clock signal provided by the clock signal line CK1 is at a high level, and the third control signal provided by the third control signal line Scan3 is at a low level.

Since the third control signal is at a low level, a voltage between the gate and the source of the second transistor M2 is $V_L'-V_H$, and the second transistor M2 is turned on. The working power supply terminal charges the control node N1 through the second transistor M2, and the voltage of the control node N1 becomes $V_H$. Since the voltage of the control node N1 is $V_H$, a voltage between the gate and the source of the third transistor M3 is 0V, and the third transistor M3 is turned off.

At the same time, the capacitor C maintains a voltage across two ends thereof unchanged due to its bootstrap effect, and the voltage of the signal output terminal OUTPUT is pulled up. However, in the process of pulling up the voltage of the signal output terminal OUTPUT, once the voltage of the signal output terminal OUTPUT is higher than $V_H$, the fourth transistor M4 is turned on, the voltage of the control node N1 is written to the signal output terminal OUTPUT through the fourth transistor M4, so as to pull down the voltage of the signal output terminal OUTPUT. It can be seen that the voltage of the signal output terminal OUTPUT will not be greater than $V_H$.

A fourth stage T4 includes three sub-stages, that is, a third sub-stage t3, a fourth sub-stage t4 and a fifth sub-stage t5.

In the third sub-stage t3, the input signal provided by the signal input terminal INPUT is at a high level, the first control signal provided by the first control signal line Scan1 is at a low level, the first clock signal provided by the clock signal line CK1 is at a high level, and the third control signal provided by the third control signal line Scan3 is at a high level.

Since the first control signal is at a low level and the input signal is at a high level, the first transistor M1 is turned on, the control node N1 is charged by the input signal at the high level through the first transistor M1 without any loss, so as to maintain the voltage of the control node N1 at $V_H$. At this time, the third transistor M3 maintains in the turn-off state.

In a case that the voltage of the control node N1 is maintained at $V_H$, the voltage output by the signal output terminal OUTPUT is maintained at the $V_H$.

In the fourth sub-stage t4, the input signal provided by the signal input terminal INPUT is at a high level, the first control signal provided by the first control signal line Scan1 is at a high level, the first clock signal provided by the clock signal line CK1 is at a low level, and the third control signal provided by the third control signal line Scan3 is at a high level.

Since the first clock signal is at a low level and the voltage of the control node N1 is $V_H$, the fourth transistor M4 is turned on, and the control node N1 writes the voltage $V_H$ to the signal output terminal OUTPUT through the fourth transistor M4, so as to maintain the voltage output by the signal output terminal at $V_H$.

In this sub-stage, the third transistor M3 maintains in the turn-off state.

In the fifth sub-stage t5, the input signal provided by the signal input terminal INPUT is at a high level, the first control signal provided by the first control signal line Scan1 is at a high level, the first clock signal provided by the clock signal line CK1 is at a high level, and the third control signal provided by the third control signal line Scan3 is at a low level.

Since the third control signal is at a low level, the second transistor M2 is turned on, the working power supply terminal charges the control node N1 through the second transistor M2, the voltage of the control node N1 is maintained at $V_H$, and the voltage output by the signal output terminal OUTPUT is maintained at $V_H$.

Meanwhile, since the voltage of the control node N1 is $V_H$, the third transistor M3 maintains in the turn-off state.

It should be noted that, in the fourth stage, the voltage of the control node N1 may be maintained at $V_H$ through the third sub-stage and the fifth sub-stage, so as to ensure that the third transistor M3 maintains in the turn-off state, preventing the third transistor M3 from being turned on inaccurately. Through the fourth sub-stage, the control node N1 can be conducted to the signal output terminal OUTPUT, so that the voltage of the signal output terminal OUTPUT is maintained at $V_H$, and the noise is reduced.

By repeating the above third sub-stage, fourth sub-stage and fifth sub-stage, the voltage of the signal output terminal OUTPUT can be maintained at $V_H$ in the fourth stage T4.

Thereafter, until the next frame arrives, after the shift register receives the low level signal of the signal input terminal INPUT, the above stages are repeated.

It should be noted that, the transistors in the above shift register are all P type transistors, which is only illustrative, but not to limit the technical solutions of the present disclosure. It should be appreciated that solutions obtained by replacing a part or all P type transistors in the shift register provided in the present embodiment with N type transistors will fall within the protection scope of this disclosure.

Figure 4:
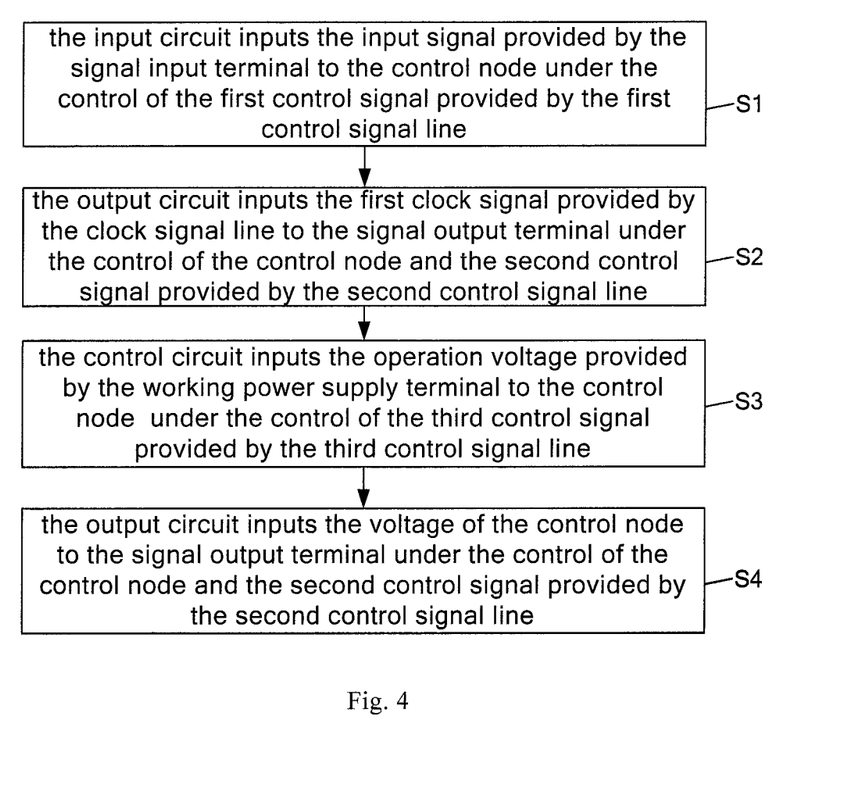
FIG. 4 is a flow chart of a driving method for a shift register in an embodiment of the disclosure.

FIG. 4 is a flow chart of a driving method for a shift register in an embodiment of the disclosure, as shown in FIG. 4, the shift register is the shift register provided by the above embodiment, specific structure of which can refer to the above embodiment, the driving method for the shift register comprises steps S1~S4.

Step S1, the input circuit inputs the input signal provided by the signal input terminal to the control node under the control of the first control signal provided by the first control signal line.

Step S2, the output circuit inputs the first clock signal provided by the clock signal line to the signal output terminal under the control of the control node and the second control signal provided by the second control signal line.

Step S3, the control circuit inputs the operation voltage provided by the working power supply terminal to the control node N1 under the control of the third control signal provided by the third control signal line.

Step S4, the output circuit inputs the voltage of the control node to the signal output terminal under the control of the control node and the second control signal provided by the second control signal line.

Specific description of the above step S1 to step S4 may refer to the above embodiment, and will not be repeated herein.

The present disclosure further provides a gate driving circuit, which comprises multiple stages of shift registers, each shift register is that provided in the above embodiment, among the multiple stages of shift registers, a signal output terminal of each stage of shift register outputs a row scan signal of the stage itself. Except for the last stage of shift register, the signal output terminal of each remaining stage of shift register is electrically connected to the signal input terminal of a next adjacent stage of shift register.

The present disclosure further provides a display apparatus, which comprises the above gate driving circuit provided in the above embodiment, specific description of the gate driving circuit may refer to the above embodiment, and will not be repeated herein In summary, the present disclosure provides a shift register and a driving method for the same, a gate driving circuit and a display apparatus. The structure of the shift register provided in the present disclosure is simple, which is beneficial to the realization of high resolution and narrow bezel of the display panel.

It can be understood that the above embodiments are only exemplary embodiments for illustrating the principle of the present disclosure; however, the present disclosure is not limited thereto. For those of ordinary skill in the art, various modifications and improvements can be made without departing from the essence of the present disclosure, and these modifications and improvements are also encompassed within the protection scope of the present disclosure.

The invention claimed is:

1. A shift register, comprising:
an input circuit;
an output circuit; and
a control circuit, wherein
the input circuit, the output circuit and the control circuit are electrically connected to a control node,
the input circuit is further electrically connected with a signal input terminal of the shift register, and is configured to input an input signal provided by the signal input terminal to the control node under the control of a first control signal provided by a first control signal line;
the control circuit is further electrically connected with a working power supply terminal, and is configured to input an operation voltage provided by the working power supply terminal to the control node under the control of a third control signal provided by a third control signal line;
the output circuit is further electrically connected with a signal output terminal of the shift register and a clock signal line, and is configured to input one of a voltage of the control node and the first clock signal provided by the clock signal line to the signal output terminal under the control of the voltage of the control node and a second control signal provided by a second control signal line, wherein
the first control signal line is configured to provide the first control signal at an active level;
the second control signal line is configured to provide the second control signal at an active level to the output circuit by delaying a first time period after the first control signal becomes an inactive level;
the third control signal line is configured to provide the third control signal at an active level to the control circuit by delaying a second time period after the second control signal becomes the inactive level,
the first control signal line is further configured to provide the first control signal at an active level again by delaying a third time period after the third control signal becomes an inactive level; and
during the second time period, the first control signal, the second control signal and the third control signal are all at inactive levels,
wherein the output circuit comprises a third transistor, a fourth transistor and a capacitor, wherein a control electrode of the third transistor is electrically connected with the control node, a first electrode of the third transistor is electrically connected with the clock signal line, and a second electrode of the third transistor is electrically connected with the signal output terminal;

a control electrode of the fourth transistor is electrically connected with the second control signal line, a first electrode of the fourth transistor is electrically connected with the control node, and a second electrode of the fourth transistor is electrically connected with the signal output terminal;

a first end of the capacitor is electrically connected with the control node, and a second end of the capacitor is electrically connected with the signal output terminal, and wherein the first control signal is a second clock signal, the second control signal is the first clock signal, and the third control signal is a third clock signal, and duty ratios of the first clock signal, the second clock signal and the third clock signal are 33%.

2. The shift register of claim 1, wherein the input circuit comprises a first transistor, wherein a control electrode of the first transistor is electrically connected with the first control signal line, a first electrode of the first transistor is electrically connected with the signal input terminal, and a second electrode of the first transistor is electrically connected with the control node.

3. The shift register of claim 1, wherein the control circuit comprises a second transistor, wherein a control electrode of the second transistor is electrically connected with the third control signal line, a first electrode of the second transistor is electrically connected with the working power supply terminal, and a second electrode of the second transistor is electrically connected with the control node.

4. The shift register of claim 2, wherein the first transistor, the second transistor, the third transistor and the fourth transistor are P type transistors.

5. The shift register of claim 1, wherein the second control signal line is electrically connected with the clock signal line.

6. A gate driving circuit comprising the shift register of claim 1.

7. A display apparatus comprising the gate driving circuit of claim 6.

8. A driving method for a shift register, wherein the shift register is the shift register of claim 1, and the driving method for the shift register comprises:

the input circuit inputs the input signal provided by the signal input terminal to the control node under the control of the first control signal provided by the first control signal line;

the output circuit inputs the first clock signal provided by the clock signal line to the signal output terminal under the control of the control node and the second control signal provided by the second control signal line;

the control circuit inputs the operation voltage provided by the working power supply terminal to the control node under the control of the third control signal provided by the third control signal line; and the output circuit inputs the voltage of the control node to the signal output terminal under the control of the control node and the second control signal provided by the second control signal line.

* * * * *